United States Patent
Xu

(10) Patent No.: US 10,069,096 B1
(45) Date of Patent: Sep. 4, 2018

(54) WOLED DEVICE

(71) Applicant: Wuhan China Star Optoelectronics Semiconductor Display Technology Co., Ltd., Wuhan (CN)

(72) Inventor: Chao Xu, Wuhan (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/561,984

(22) PCT Filed: Aug. 18, 2017

(86) PCT No.: PCT/CN2017/098129
§ 371 (c)(1),
(2) Date: Sep. 27, 2017

(30) Foreign Application Priority Data

Jun. 21, 2017 (CN) .......................... 2017 1 0477266

(51) Int. Cl.
*H01L 51/50* (2006.01)
*H01L 27/32* (2006.01)
(Continued)

(52) U.S. Cl.
CPC ...... *H01L 51/5016* (2013.01); *H01L 27/3206* (2013.01); *H01L 51/0034* (2013.01); *H01L 51/50* (2013.01); *H01L 51/5004* (2013.01); *H01L 51/5056* (2013.01); *H01L 51/5068* (2013.01); *H01L 51/5072* (2013.01); *H01L 51/5084* (2013.01); *H01L 51/5096* (2013.01); *H01L 51/5218* (2013.01); *H01L 51/5234* (2013.01)

(58) Field of Classification Search
CPC .................................................. H01L 51/5084
See application file for complete search history.

(56) References Cited

U.S. PATENT DOCUMENTS

2015/0069350 A1  3/2015  Kim et al.
2015/0295205 A1  10/2015  Lee et al.

FOREIGN PATENT DOCUMENTS

CN    101584057 A    11/2009
CN    102197507 A    9/2011
(Continued)

*Primary Examiner* — Cheung Lee
(74) *Attorney, Agent, or Firm* — Leong C. Lei

(57) ABSTRACT

The invention provides a WOLED device comprising, from bottom up, a totally reflective anode, a hole transport layer, an electron blocking layer, a red phosphorescent light-emitting layer (EML), a blue fluorescent EML, a green phosphorescent EML, a hole blocking layer, an electron transport layer and a semi-transparent cathode; wherein the host material of red phosphorescent EML is a hole transport type host material, the host material of blue fluorescent EML is a bipolar transmission type host material, and the green host material of green phosphorescent EML is an electron transport type host material. The invention improves the utilization ratio of electrons and holes by adding electron blocking layer and hole blocking layer, and adopting total reflection anode and semi-transparent cathode. Through selecting host material and energy level, the invention utilizes the singlet and triplet exciton generated by blue fluorescent material to substantially increase luminous efficiency of WOLED devices.

15 Claims, 2 Drawing Sheets

(51) Int. Cl.
*H01L 51/52* (2006.01)
*H01L 51/00* (2006.01)

(56) References Cited

FOREIGN PATENT DOCUMENTS

| | | |
|---|---|---|
| CN | 106410053 A | 2/2017 |
| CN | 106654049 A | 5/2017 |
| JP | 2008034701 A | 2/2008 |
| JP | 2012204794 A | 10/2012 |

WOLED DEVICE

BACKGROUND OF THE INVENTION

1. Field of the Invention

The present invention relates to the field of display techniques, and in particular to a white organic light-emitting diode (WOLED) device.

2. The Related Arts

The active matrix panel display provides the advantages of thinness, saving-power, no radiation and many other advantages, and has been widely used. The organic light-emitting diode (OLED) display technology is a highly promising panel display technology, as the OLED has a very excellent display performance, such as, active-luminous, simple structure, ultra-thin, fast response, wide viewing angle, low power consumption and ability to achieve flexible display, and so on, and is known as the "dream display". Coupled with lower production equipment investment than the thin film transistor liquid crystal display screen (TFT-LCD), the OLED has attracted the major display manufacturers and has become the mains technology in the field of the third generation display device. At present, OLED is on the edge of starting mass production. With the new technology continuing to emerge, OLED display device is heralded to hold a breakthrough development.

To achieve the full color of the OLED display, one approach is through a stack of white organic light emitting diode (WOLED) and color filter (CF), wherein the WOLED and CF layered stack structure does not require a precise mask process to achieve high resolution OLED display, so WOLED display device is widely recognized as the focus of next generation display technology.

At present, the singlet exciton and the triplet exciton produced by the phosphorescent material can be used, and the WOLED device prepared by the phosphorescent material is more efficient; only the singlet exciton of the fluorescent material can be used, and the WOLED device efficiency is very low (<25%). But so far, no suitable blue phosphorescent material has been found, and only through the use of blue fluorescent material and red, green phosphorescent material combination to design the WLOED device. As such, the triplet exciton generated by blue fluorescent material cannot be used, and the efficiency of WLOED devices greatly restricted.

SUMMARY OF THE INVENTION

The object of the present invention is to provide a WOLED device, able to expand the exciton generation zone and fully utilize the singlet exciton and triplet exciton generated by the blue fluorescent material to effectively improve the WOLED efficiency.

To achieve the above object, the present invention provides a WOLED device, comprising: disposed from bottom to top in a stack of: a total reflection anode, a hole transport layer (HTL), an electron blocking layer, a red phosphorescent light-emitting layer, a blue fluorescent light-emitting layer, a green phosphorescent light-emitting layer, a hole blocking layer, an electron transport layer (ETL), and a semi-transparent cathode;

wherein the red phosphorescent light-emitting layer, the blue fluorescent light-emitting layer and the green phosphorescent light-emitting layer together forming a white light-emitting layer; each of the red phosphorescent light-emitting layer, the blue fluorescent light-emitting layer and the green phosphorescent light-emitting layer comprising a host material and a guest material;

the host material of the red phosphorescent light-emitting layer being a hole transport type host material, the guest material of the red phosphorescent light-emitting layer being a red phosphorescent material;

the host material of the blue fluorescent light-emitting layer being a bipolar transmission type host material, the guest material of the blue fluorescent light-emitting layer being a blue fluorescent material;

the host material of the green phosphorescent light-emitting layer being an electron transport type host material, the guest material of the green phosphorescent light-emitting layer being a green phosphorescent material.

According to a preferred embodiment of the present invention, the electron blocking layer has a lowest unoccupied molecular orbital (LUMO) energy level 0.3 ev-1.5 ev higher than the LUMO energy level of the hole transport type host material.

According to a preferred embodiment of the present invention, the hole blocking layer has a highest occupied molecular orbital (HOMO) energy level 0.3 ev-1.5 ev lower than the HOMO energy level of the electron transport type host material.

According to a preferred embodiment of the present invention, the triplet energy level of the blue fluorescent material is higher than the triplet energy level of the red phosphorescent material and the triplet energy level of the green phosphorescent material.

According to a preferred embodiment of the present invention, the host material of the red phosphorescent layer is:
4,4',4''-Tri(9-carbazoyl)triphenylamine (TCTA), or
4,4'-Bis(9-carbazolyl)-1,1'-biphenyl (CBP).

According to a preferred embodiment of the present invention, the host material of the blue fluorescent layer is:
2,5-bis(2-(9H-carbazol-9-yl)phenyl)-1,3,4-oxadiazole (o-CZOXD), or
3-(diphenylphosphoryl)-9-(4-(diphenylphosphoryl)ph (PPO21).

According to a preferred embodiment of the present invention, the host material of the green phosphorescent layer is:
2,9-dimethyl-4,7-diphenyl-1,10-phenanthrolin (BCP), or
1,3,5-Tris(1-phenyl-1H-benzimidazol-2-yl)benzene (TPBI).

According to a preferred embodiment of the present invention, the WOLED device further comprises a light extracting layer disposed on the semi-transparent cathode.

According to a preferred embodiment of the present invention, the red phosphorescent light-emitting layer, the blue fluorescent light-emitting layer and the green phosphorescent light-emitting layer are respectively obtained by co-evaporation of the host material and the guest material, or coating after mixing to form a film.

According to a preferred embodiment of the present invention, the total reflection anode is made of a stack compound material of indium tin oxide (ITO) layer, a silver layer (Ag) and an ITO layer (ITO/Ag/ITO), and the semi-transparent cathode is made of a material of magnesium silver (Mg—Ag) alloy.

The present invention also provides a WOLED device, comprising: disposed from bottom to top in a stack of: a total reflection anode, a hole transport layer (HTL), an electron blocking layer, a red phosphorescent light-emitting layer, a blue fluorescent light-emitting layer, a green phosphorescent light-emitting layer, a hole blocking layer, an electron transport layer (ETL), and a semi-transparent cathode;

wherein the red phosphorescent light-emitting layer, the blue fluorescent light-emitting layer and the green phosphorescent light-emitting layer together forming a white light-emitting layer; each of the red phosphorescent light-emitting layer, the blue fluorescent light-emitting layer and the green phosphorescent light-emitting layer comprising a host material and a guest material;

the host material of the red phosphorescent light-emitting layer being a hole transport type host material, the guest material of the red phosphorescent light-emitting layer being a red phosphorescent material;

the host material of the blue fluorescent light-emitting layer being a bipolar transmission type host material, the guest material of the blue fluorescent light-emitting layer being a blue fluorescent material;

the host material of the green phosphorescent light-emitting layer being an electron transport type host material, the guest material of the green phosphorescent light-emitting layer being a green phosphorescent material;

wherein the electron blocking layer having a lowest unoccupied molecular orbital (LUMO) energy level 0.3 ev-1.5 ev higher than the LUMO energy level of the hole transport type host material.

wherein the hole blocking layer having a highest occupied molecular orbital (HOMO) energy level 0.3 ev-1.5 ev lower than the HOMO energy level of the electron transport type host material.

wherein the triplet energy level of the blue fluorescent material beings higher than the triplet energy level of the red phosphorescent material and the triplet energy level of the green phosphorescent material.

wherein the host material of the red phosphorescent layer being:
4,4',4"-Tri(9-carbazoyl)triphenylamine (TCTA), or
4,4'-Bis(9-carbazolyl)-1,1'-biphenyl (CBP).

wherein the host material of the blue fluorescent layer being:
2,5-bis(2-(9H-carbazol-9-yl)phenyl)-1,3,4-oxadiazole (o-CZOXD), or
3-(diphenylphosphoryl)-9-(4-(diphenylphosphoryl)ph (PPO21).

Compared to the known techniques, the present invention provides the following advantages. The present invention provides a WOLED device comprising, stacked from the bottom to top, a totally reflective anode, a hole transport layer, an electron blocking layer, a red phosphorescent light-emitting layer, a blue fluorescent light-emitting layer, a green phosphorescent light-emitting layer, a hole blocking layer, an electron transport layer and a semi-transparent cathode; wherein the host material of the red phosphorescent light-emitting layer is a hole transport type host material, the host material of the blue fluorescent light-emitting layer is a bipolar transmission type host material, and the green host material of the phosphorescent light-emitting layer is an electron transport type host material. The invention can effectively improve the utilization ratio of electrons and holes by increasing the electron blocking layer and the hole blocking layer and adopting the total reflection anode and the semi-transparent cathode. Through selecting reasonable host material and energy level design, the invention can fully utilize the singlet exciton and triplet exciton generated by blue fluorescent material to achieve a substantial increase in the luminous efficiency of WOLED devices.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
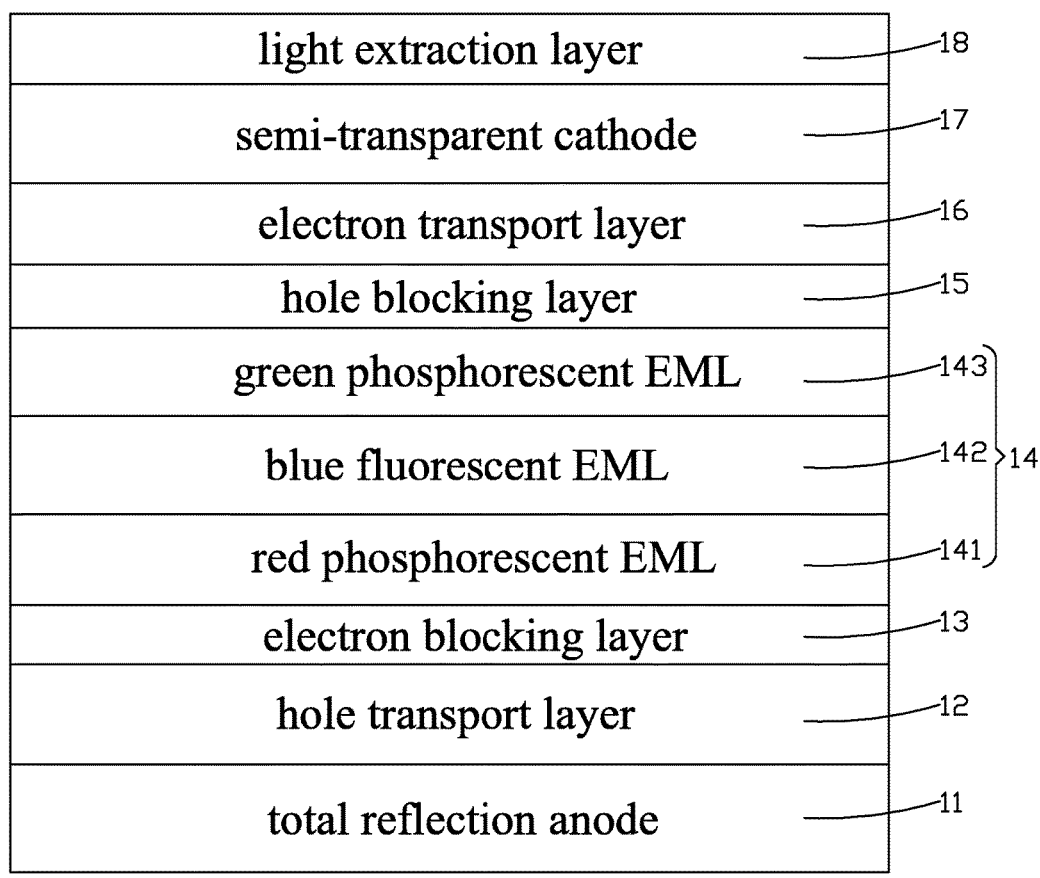
FIG. 1 is a schematic view showing the structure of WOLED device provided by an embodiment of the present invention.

Referring to FIG. 1, the present invention provides a WOLED device, comprising: disposed from bottom to top in a stack of: a total reflection anode 11, a hole transport layer (HTL) 12, an electron blocking layer 13, a red phosphorescent light-emitting layer (EML) 141, a blue fluorescent light-emitting layer EML) 142, a green phosphorescent light-emitting layer (EML) 143, a hole blocking layer 15, an electron transport layer (ETL) 16, and a semi-transparent cathode 17.

Wherein the red phosphorescent light-emitting layer 141, the blue fluorescent light-emitting layer 142 and the green phosphorescent light-emitting layer 143 together form a white light-emitting layer 14; each of the red phosphorescent light-emitting layer 141, the blue fluorescent light-emitting layer 142 and the green phosphorescent light-emitting layer 143 comprises a host material and a guest material.

The host material of the red phosphorescent light-emitting layer 141 is a hole transport type host material, such as, 4,4',4"-Tri(9-carbazoyl)triphenylamine (TCTA), or 4,4'-Bis(9-carbazolyl)-1,1'-biphenyl (CBP); the guest material of the red phosphorescent light-emitting layer 141 is a red phosphorescent material.

The host material of the blue fluorescent light-emitting layer 142 is a bipolar transmission type host material, such as,
2,5-bis(2-(9H-carbazol-9-yl)phenyl)-1,3,4-oxadiazole (o-CZOXD), or
3-(diphenylphosphoryl)-9-(4-(diphenylphosphoryl)ph (PPO21); the guest material of the blue fluorescent light-emitting layer 142 is a blue fluorescent material.

The host material of the green phosphorescent light-emitting layer 143 is an electron transport type host material, such as,
2,9-dimethyl-4,7-diphenyl-1,10-phenanthrolin (BCP), or
1,3,5-Tris(1-phenyl-1H-benzimidazol-2-yl)benzene (TPBI); the guest material of the green phosphorescent light-emitting layer 143 is a green phosphorescent material.

Figure 2:
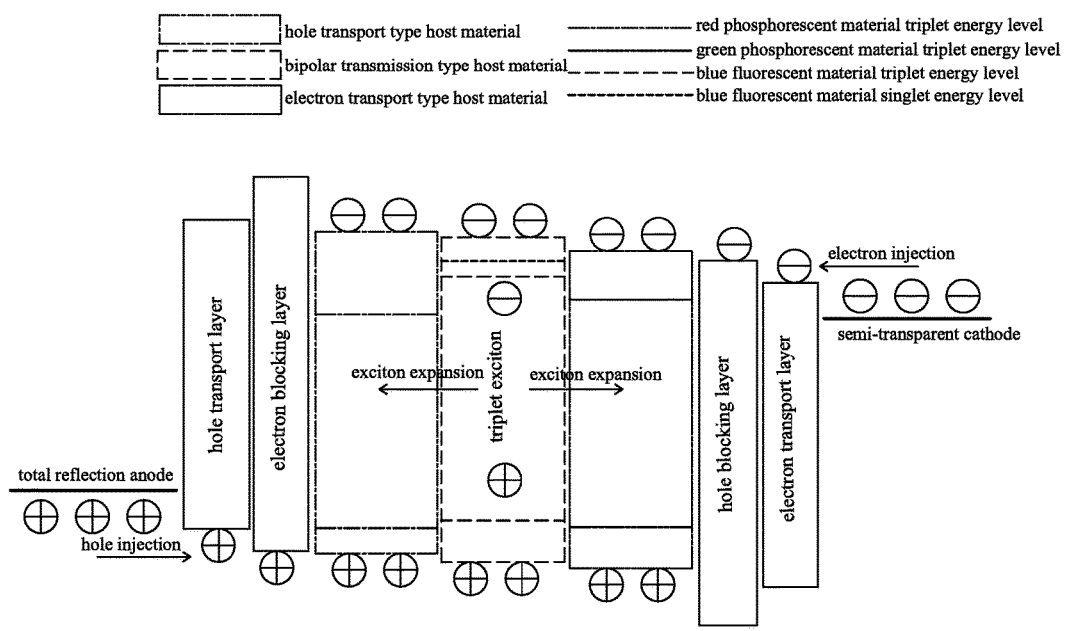
FIG. 2 is a schematic view showing energy level of the WOLED device provided by an embodiment of the present invention.

Specifically, as shown in FIG. 2, the electron blocking layer 13 has a lowest unoccupied molecular orbital (LUMO) energy level much higher than the LUMO energy level of the hole transport type host material. Moreover, the electron blocking layer 13 has a LUMO energy level 0.3 ev-1.5 ev higher than the LUMO energy level of the hole transport type host material Specifically, as shown in FIG. 2, the hole blocking layer 15 has a highest occupied molecular orbital (HOMO) energy level much lower than the HOMO energy level of the electron transport type host material. Moreover, the hole blocking layer 15 has a HOMO energy level 0.3 ev-1.5 ev lower than the HOMO energy level of the electron transport host material.

Specifically, as shown in FIG. 2, the triplet energy level of the blue fluorescent material is higher than the triplet energy level of the red phosphorescent material and the triplet energy level of the green phosphorescent material.

Specifically, to improve light coupling output, the WOLED device further comprises a light extracting layer 18 disposed on the semi-transparent cathode 17.

Specifically, the red phosphorescent light-emitting layer 141, the blue fluorescent light-emitting layer 142 and the green phosphorescent light-emitting layer 143 are all host and guest doping systems, and the host guest doping system may be formed by vapor deposition or spin coating. The red phosphorescent light-emitting layer 141, the blue fluorescent light-emitting layer 142, and the green phosphorescent light-emitting layer 143 respectively may be co-evaporated by a respective host material and a guest material, or may be prepared by coating after mixing to form a film.

Specifically, the total reflection anode 11 is made of a stack compound material of indium tin oxide (ITO) layer, a silver layer (Ag) and an ITO layer (ITO/Ag/ITO), and the semi-transparent cathode 17 is made of a material of magnesium silver (Mg—Ag) alloy.

In summary, the present invention provides a WOLED device comprising, stacked from the bottom to top, a totally reflective anode, a hole transport layer, an electron blocking layer, a red phosphorescent light-emitting layer, a blue fluorescent light-emitting layer, a green phosphorescent light-emitting layer, a hole blocking layer, an electron transport layer and a semi-transparent cathode; wherein the host material of the red phosphorescent light-emitting layer is a hole transport type host material, the host material of the blue fluorescent light-emitting layer is a bipolar transmission type host material, and the green host material of the phosphorescent light-emitting layer is an electron transport type host material. The invention can effectively improve the utilization ratio of electrons and holes by increasing the electron blocking layer and the hole blocking layer and adopting the total reflection anode and the semi-transparent cathode. Through selecting reasonable host material and energy level design, the invention can fully utilize the singlet exciton and triplet exciton generated by blue fluorescent material to achieve a substantial increase in the luminous efficiency of WOLED devices.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A white organic light-emitting diode (WOLED) device, comprising: disposed from bottom to top in a stack of: a total reflection anode, a hole transport layer (HTL), an electron blocking layer, a red phosphorescent light-emitting layer, a blue fluorescent light-emitting layer, a green phosphorescent light-emitting layer, a hole blocking layer, an electron transport layer (ETL), and a semi-transparent cathode;
   wherein the red phosphorescent light-emitting layer, the blue fluorescent light-emitting layer and the green phosphorescent light-emitting layer together forming a white light-emitting layer; each of the red phosphorescent light-emitting layer, the blue fluorescent light-emitting layer and the green phosphorescent light-emitting layer comprising a host material and a guest material;
   the host material of the red phosphorescent light-emitting layer being a hole transport type host material, the guest material of the red phosphorescent light-emitting layer being a red phosphorescent material;
   the host material of the blue fluorescent light-emitting layer being a bipolar transmission type host material, the guest material of the blue fluorescent light-emitting layer being a blue fluorescent material;
   the host material of the green phosphorescent light-emitting layer being an electron transport type host material, the guest material of the green phosphorescent light-emitting layer being a green phosphorescent material.

2. The WOLED device as claimed in claim 1, wherein the electron blocking layer has a lowest unoccupied molecular orbital (LUMO) energy level 0.3 ev-1.5 ev higher than the LUMO energy level of the hole transport type host material.

3. The WOLED device as claimed in claim 1, wherein the hole blocking layer has a highest occupied molecular orbital (HOMO) energy level 0.3 ev-1.5 ev lower than the HOMO energy level of the electron transport type host material.

4. The WOLED device as claimed in claim 1, wherein a triplet energy level of the blue fluorescent material is higher than a triplet energy level of the red phosphorescent material and a triplet energy level of the green phosphorescent material.

5. The WOLED device as claimed in claim 1, wherein the host material of the red phosphorescent layer is: 4,4',4"-Tri(9-carbazoyl)triphenylamine (TCTA), or 4,4'-Bis(9-carbazolyl)-1,1'-biphenyl (CBP).

6. The WOLED device as claimed in claim 1, wherein the host material of the blue fluorescent layer is:
   2,5-bis(2-(9H-carbazol-9-yl)phenyl)-1,3,4-oxadiazole (o-CZOXD), or
   3-(diphenylphosphoryl)-9-(4-(diphenylphosphoryl)ph (PPO21).

7. The WOLED device as claimed in claim 1, wherein the host material of the green phosphorescent layer is:
   2,9-dimethyl-4,7-diphenyl-1,10-phenanthrolin (BCP), or
   1,3,5-Tris(1-phenyl-1H-benzimidazol-2-yl)benzene (TPBI).

8. The WOLED device as claimed in claim 1, wherein the WOLED device further comprises a light extracting layer disposed on the semi-transparent cathode.

9. The WOLED device as claimed in claim 1, wherein the red phosphorescent light-emitting layer, the blue fluorescent light-emitting layer and the green phosphorescent light-emitting layer are respectively obtained by co-evaporation of the host material and the guest material, or coating after mixing to form a film.

10. The WOLED device as claimed in claim 1, wherein the total reflection anode is made of a stack compound material of indium tin oxide (ITO) layer, a silver layer (Ag)

and an ITO layer (ITO/Ag/ITO), and the semi-transparent cathode is made of a material of magnesium silver (Mg—Ag) alloy.

11. A white organic light-emitting diode (WOLED) device, comprising: disposed from bottom to top in a stack of: a total reflection anode, a hole transport layer (HTL), an electron blocking layer, a red phosphorescent light-emitting layer, a blue fluorescent light-emitting layer, a green phosphorescent light-emitting layer, a hole blocking layer, an electron transport layer (ETL), and a semi-transparent cathode;
- wherein the red phosphorescent light-emitting layer, the blue fluorescent light-emitting layer and the green phosphorescent light-emitting layer together forming a white light-emitting layer; each of the red phosphorescent light-emitting layer, the blue fluorescent light-emitting layer and the green phosphorescent light-emitting layer comprising a host material and a guest material;
- the host material of the red phosphorescent light-emitting layer being a hole transport type host material, the guest material of the red phosphorescent light-emitting layer being a red phosphorescent material;
- the host material of the blue fluorescent light-emitting layer being a bipolar transmission type host material, the guest material of the blue fluorescent light-emitting layer being a blue fluorescent material;
- the host material of the green phosphorescent light-emitting layer being an electron transport type host material, the guest material of the green phosphorescent light-emitting layer being a green phosphorescent material;
- wherein the electron blocking layer having a lowest unoccupied molecular orbital (LUMO) energy level 0.3 ev-1.5 ev higher than the LUMO energy level of the hole transport type host material;
- wherein the hole blocking layer having a highest occupied molecular orbital (HOMO) energy level 0.3 ev-1.5 ev lower than the HOMO energy level of the electron transport type host material;
- wherein the host material of the red phosphorescent layer being:
- 4,4',4''-Tri(9-carbazoyl)triphenylamine (TCTA), or
- 4,4'-Bis(9-carbazolyl)-1,1'-biphenyl (CBP)
- wherein a gate, a source and a drain being made of one or more of the materials of molybdenum (Mo), aluminum (Al), and titanium (Ti);
- wherein the host material of the blue fluorescent layer being:
- 2,5-bis(2-(9H-carbazol-9-yl)phenyl)-1,3,4-oxadiazole (o-CZOXD), or
- 3-(diphenylphosphoryl)-9-(4-(diphenylphosphoryl)ph (PPO21).

12. The WOLED device as claimed in claim 11, wherein the host material of the green phosphorescent layer is:
- 2,9-dimethyl-4,7-diphenyl-1,10-phenanthrolin (BCP), or
- 1,3,5-Tris(1-phenyl-1H-benzimidazol-2-yl)benzene (TPBI).

13. The WOLED as claimed in claim 11, wherein the WOLED device further comprises a light extracting layer disposed on the semi-transparent cathode.

14. The WOLED device as claimed in claim 11, wherein the red phosphorescent light-emitting layer, the blue fluorescent light-emitting layer and the green phosphorescent light-emitting layer are respectively obtained by co-evaporation of the host material and the guest material, or coating after mixing to form a film.

15. The WOLED as claimed in claim 11, wherein the total reflection anode is made of a stack compound material of indium tin oxide (ITO) layer, a silver layer (Ag) and an ITO layer (ITO/Ag/ITO), and the semi-transparent cathode is made of a material of magnesium silver (Mg—Ag) alloy.

* * * * *